United States Patent
Zhu

(10) Patent No.: US 7,808,055 B2
(45) Date of Patent: Oct. 5, 2010

(54) METHODS AND APPARATUS FOR SEMICONDUCTOR MEMORY DEVICES MANUFACTURABLE USING BULK CMOS PROCESS MANUFACTURING

(75) Inventor: Yiming Zhu, Belmont, CA (US)

(73) Assignee: GigaDevice Semiconductor Inc., Beijing (CN)

( * ) Notice: Subject to any disclaimer, the term of this patent is extended or adjusted under 35 U.S.C. 154(b) by 0 days.

(21) Appl. No.: 11/766,763

(22) Filed: Jun. 21, 2007

(65) Prior Publication Data

US 2008/0315268 A1 Dec. 25, 2008

(51) Int. Cl.
*H01L 29/06* (2006.01)
(52) U.S. Cl. .................. 257/397; 257/396; 257/506; 257/E29.02; 257/E29.021
(58) Field of Classification Search .................. 257/396, 257/397, 506, E29.02, E29.021
See application file for complete search history.

(56) References Cited

U.S. PATENT DOCUMENTS

| | | | | |
|---|---|---|---|---|
| 5,015,594 A | * | 5/1991 | Chu et al. | 438/207 |
| 6,144,076 A | * | 11/2000 | Puchner et al. | 257/369 |
| 6,169,007 B1 | * | 1/2001 | Pinter | 438/320 |
| 6,538,278 B1 | * | 3/2003 | Chau | 257/324 |
| 6,674,127 B2 | * | 1/2004 | Kotani | 257/347 |
| 7,214,989 B2 | * | 5/2007 | Ushiroda et al. | 257/369 |
| 7,285,818 B2 | * | 10/2007 | Dhaoui et al. | 257/316 |

* cited by examiner

*Primary Examiner*—Victor A Mandala
(74) *Attorney, Agent, or Firm*—Venture Pacific Law, PC

(57) ABSTRACT

The present invention discloses semiconductor devices that can be manufactured utilizing standard process of manufacturing and that can hold information. In accordance with a presently preferred embodiment of the present invention, one or more semiconductor devices can be formed in a well on a substrate where isolation trenches surround one or more devices to create storage regions (floating wells) that is capable of holding a charge. Depending on the charge in the storage region (floating well), it can represent information. The semiconductor devices of the present invention can be manufactured using the standard process of manufacturing (bulk cmos processing).

16 Claims, 6 Drawing Sheets

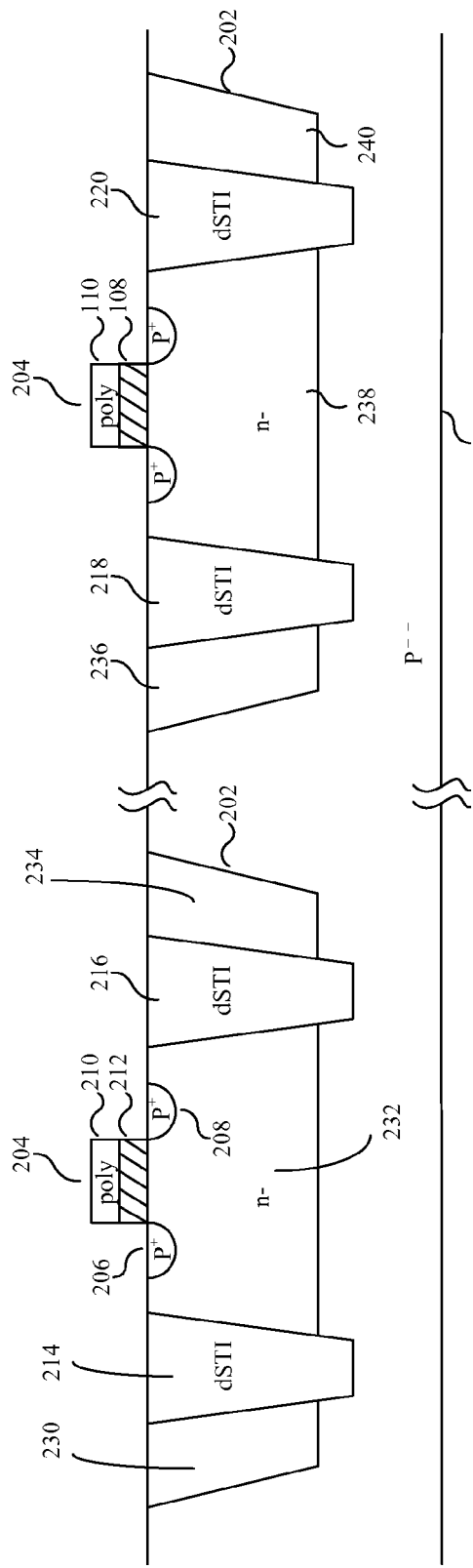
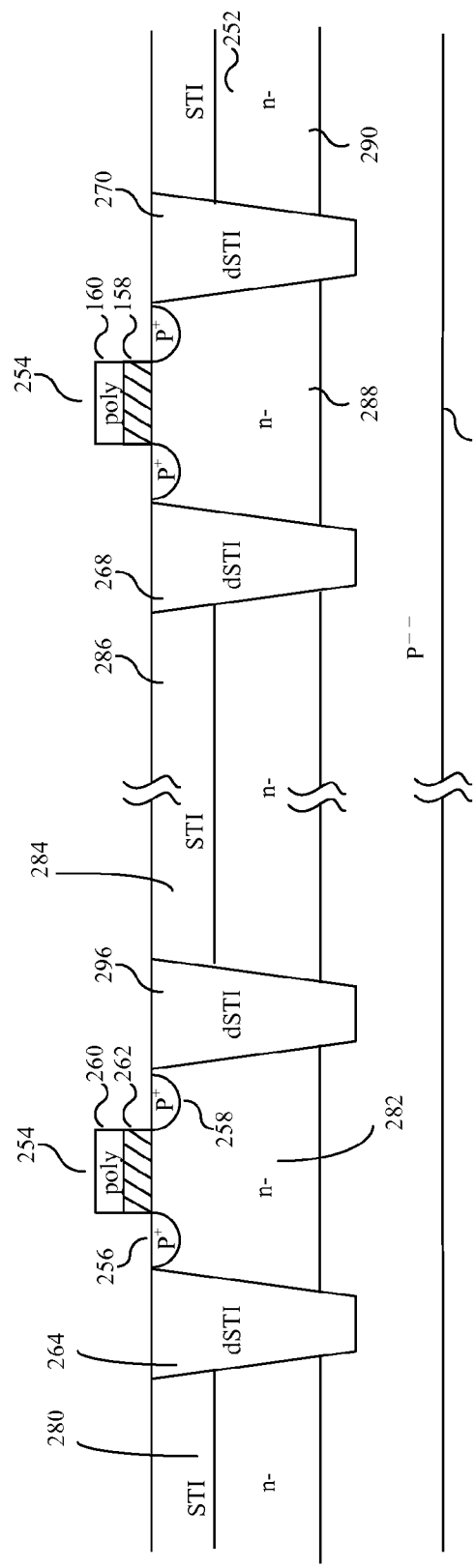
Fig. 2A
Fig. 2B

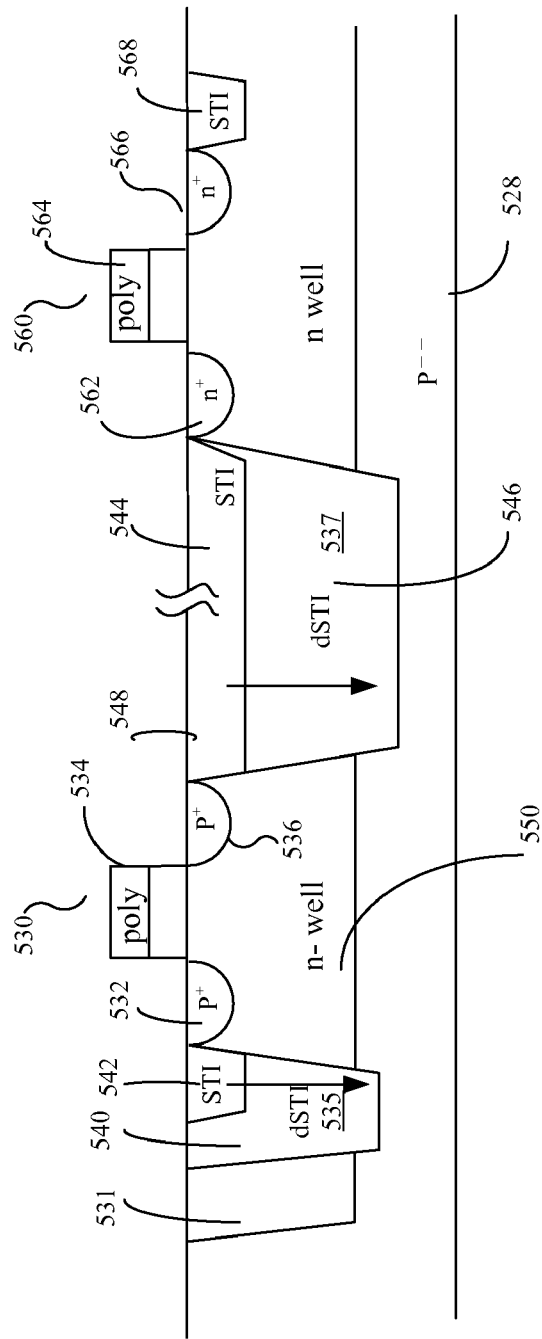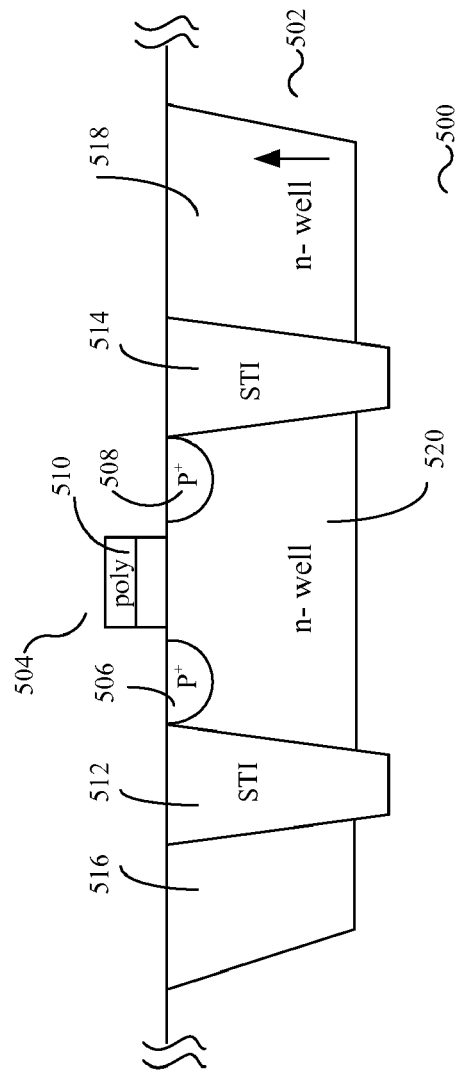
Fig. 4B
Fig. 4A

METHODS AND APPARATUS FOR SEMICONDUCTOR MEMORY DEVICES MANUFACTURABLE USING BULK CMOS PROCESS MANUFACTURING

FIELD OF INVENTION

The present invention relates to semiconductor devices, in particular to semiconductor devices capable of storing information.

BACKGROUND

In the manufacturing of the semiconductor devices, a widely utilized and cost efficient type of manufacturing process offered by many foundries is the standard process (or bulk cmos processing). In standard process manufacturing of semiconductor devices, referring to FIG. 1a, as an illustration, a bulk substrate doped to be p- 100 and one or more n-wells 101 may be deposited thereon. Within the well 101, one method of electrically isolating the active device regions is to form a trench isolation region 104 between adjacent devices 106. Such prior art trench isolation regions typically comprise a trench that is formed within the substrate and filled with a dielectric material such as SiO2. Active device regions can also be formed outside of the well separated by one or more isolation regions. The active devices can be any semiconductor devices. Here, CMOS devices are illustrated 106 each having drain, source, and gate terminals 102, 103, and 110. Each of the active devices can be a pmos or an nmos.

Three categories of trench isolation regions are known, including shallow trenches (trenches whose depth is less than about 1 um), moderate trenches (trenches whose depth is from about 1 to about 3 mum), and deep trenches (trenches whose depth is greater than 3 mum). Note that the exact depth can be relative and not necessarily be the measurements provided here. As the size of the semiconductor devices is continuously being scaled down, there is a greater interest in employing shallow trench isolation ("STI") regions. The active device regions 106 may have an insulation layer 108 and a poly layer 110 acting as the gate for the device.

FIG. 1b illustrates yet another prior art silicon-on-insulate ("SOI") process where an insulation layer 122 is deposited on a wafer substrate 120, and the insulation layer can be a dielectric material such as SiO2 having a high k constant. On top of the insulation layer 122, there are active devices 124, 126, and 128, that may be separated by regions 132, 134, 135, and 138 that are doped accordingly. Each active device has a couple of terminals 130, 134, and a channel 132. Note that the active devices may have different types of doping. Here, devices 124 and 128 have n- channels and p+ terminals, while device 126 has a p- channel and n+ terminals.

While the standard process presents offers cost advantages in the manufacturing of semiconductor devices, but using the standard process in the manufacturing of a memory cell still requires the use of a 6-transister structure (and in some cases a 4-transister structure) for a memory cell. Thus, for certain applications, the space required on a die for the memory block can be quite significant. For example, many system-on-a-chip applications require large blocks of memory cells, requiring large real estate on the die and an expensive application.

As the geometry of the semiconductor devices continue to shrink, there is a strong desire to shrink the memory cell/memory block as well. However, given the 6-transister (and 4-transister) memory cell structure, it is difficult to shrink the memory cell using the standard process of manufacturing.

Furthermore, generally speaking, memory devices require different, and quite often proprietary, type of manufacturing processes. Thus, memory devices are more expensive to manufacture and any proprietary processes might require an entirely new foundry all together, raising the entry barrier even higher.

Accordingly, there is a desire for manufacturing memory devices utilizing cost-efficient standard process of manufacturing.

SUMMARY OF INVENTION

An object of the present invention is to provide a semiconductor device capable of holding information where the semiconductor device can be manufactured using standard process of manufacturing.

Another object of the present invention is to provide a semiconductor device manufacturable using standard process of manufacturing and operable as a memory device.

Yet another object of the present invention is to provide a memory device that is easily manufacturable and operable, and is cost efficient in both the manufacturing cost and power consumption.

The present invention discloses semiconductor devices that can hold information and that can be manufactured utilizing standard process of manufacturing. In accordance with a presently preferred embodiment of the present invention, one or more semiconductor devices can be formed in a well on a substrate where isolation trenches are used in the well to create storage regions that is capable of holding a charge. Depending on the charge in the storage region, it can represent information. The semiconductor devices of the present invention can be manufactured using the logic process of manufacturing.

An advantage of the present invention is that it provides a semiconductor device capable of holding information where the semiconductor device can be manufactured using logic process of manufacturing.

Another advantage of the present invention is that it provides a semiconductor device manufacturable using logic process of manufacturing and operable as a memory device.

Yet another advantage of the present invention is that it provides a memory device that is easily manufacturable and operable, and is cost efficient in both the manufacturing cost and power consumption.

Other aspects and advantages of the present invention will become apparent to those skilled in the art from reading the following detailed description when taken in conjunction with the accompanying drawings.

BRIEF DESCRIPTION OF DRAWINGS

FIG. 2a illustrates a preferred embodiment of a semiconductor device of the present invention.

FIG. 2b illustrates another preferred embodiment of a semiconductor device of the present invention.

FIG. 4A illustrates a structure of a preferred embodiment of the present invention.

FIG. 4B illustrates another structure of the preferred embodiment of the present invention where there are various isolation trenches.

DETAILED DESCRIPTION

Figure 1A:
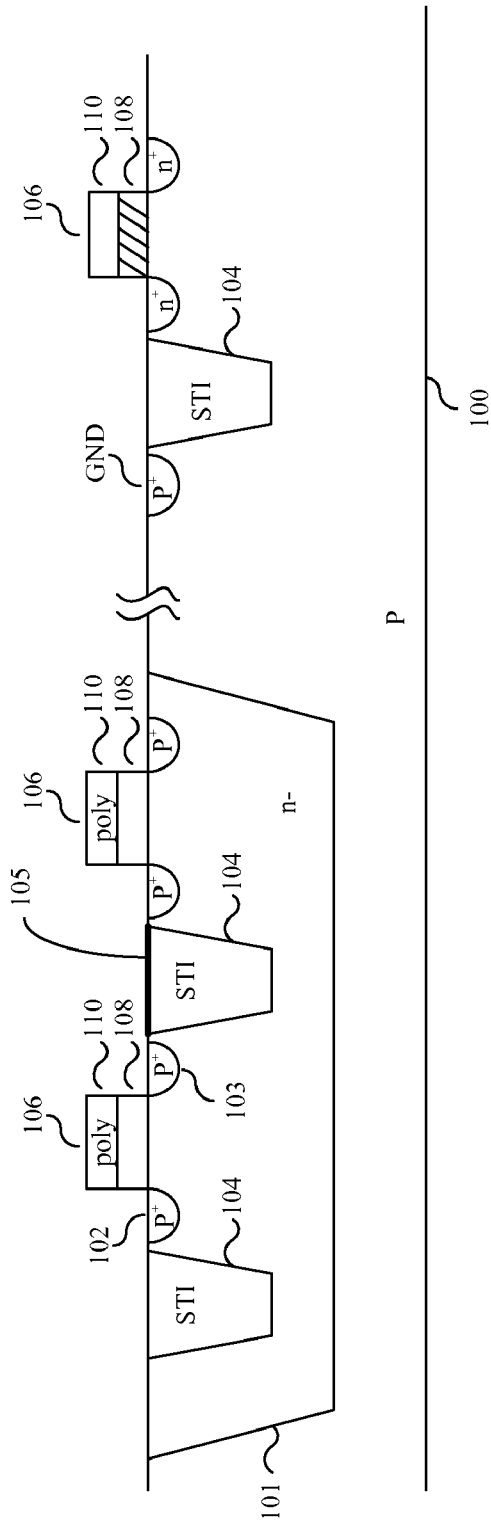
FIG. 1a illustrates a conventional prior art structure of a semiconductor device manufacturable using the logic process of manufacturing.
Figure 1B:
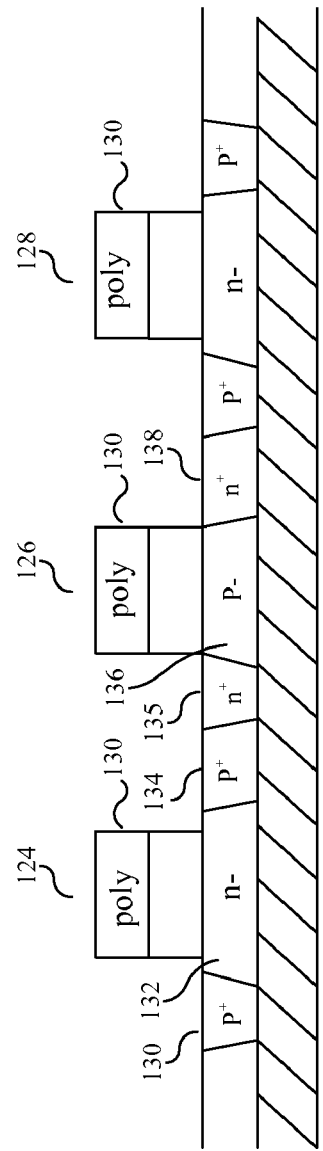
FIG. 1b illustrates yet another conventional prior art structure of a semiconductor device manufacturable using the logic process of manufacturing.

The present invention will now be described in detail with reference to preferred embodiments as illustrated in the accompanying figures. During the description, specific details are set forth in order to provide a thorough understanding of the present invention. However, it will be apparent to one skilled in the art that the present invention may be practiced without some or all of the specific details. In order to not unnecessarily obscure the present invention, some well know process steps or structures may not have been described in detail. In one embodiment, the present invention relates to semiconductor memories, and more particularly to memories and structures of such which provide efficient fabrication and functionality of the memories using preferred logic process of manufacturing.

Referring to FIG. 2a, a presently preferred embodiment of the present invention is illustrated, where there is a substrate 200 and wells 202 deposited on the substrate 200. Each of the well 202 may have one or more devices 204 and each of the devices 204 may have several terminals 206, 208, and 210. The devices can be active or passive devices. There may be one or more isolation regions, 214, 216, 218, and 220 ("dSTI"), effectively dividing the well into several areas, 230, 232, 234, 236, 238 and 240. The isolation regions can be STI regions or otherwise.

An important aspect of the present invention is that the isolation regions are deeper than the well itself, such that several of the regions can have its own voltage potential and be a storage region (also referred to as a floating well) (e.g. 232, 238). Note that the isolation regions illustrated in FIG. 2a are STI regions but any type of isolation regions or methods that can electrically isolate the well into several regions capable of holding different voltage potentials can be used.

FIG. 2b illustrates yet another embodiment of the present invention. Here, there is a STI layer on top of the n- regions, and there may be several devices in a well. Again, there are floating wells (or storage regions) formed 282 and 288.

Figure 3A:
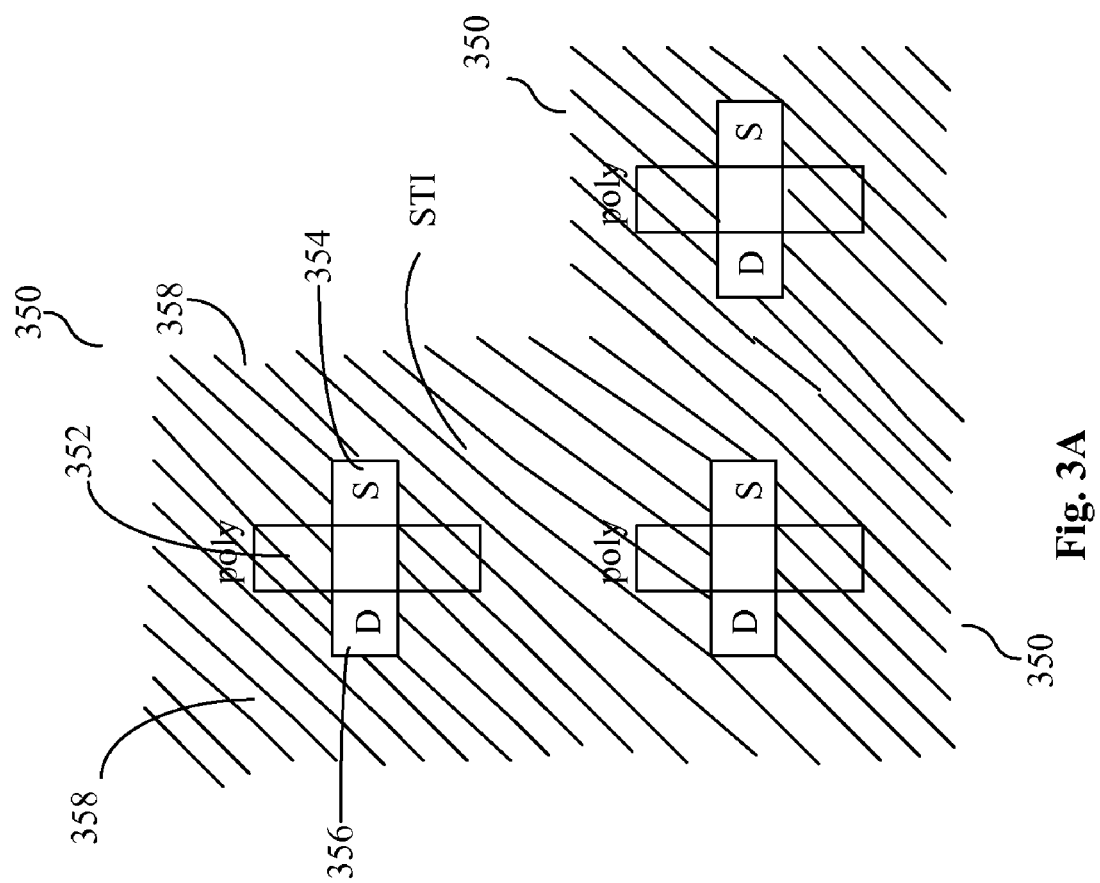
FIG. 3a illustrates a top view of a preferred embodiment of a semiconductor device of the present invention.

With the structure of the present invention, FIG. 3a illustrates a top view of an embodiment of the present invention. Here, each area 350 contains a device separated by one or more isolation regions 358. With each device, here in this illustration, there is a drain terminal 356, source terminal 354, and a poly (gate) terminal 352. In this illustration, the floating well is beneath the drain terminal, source terminal, and the intersection of the poly and the drain/source terminal.

Figure 3B:
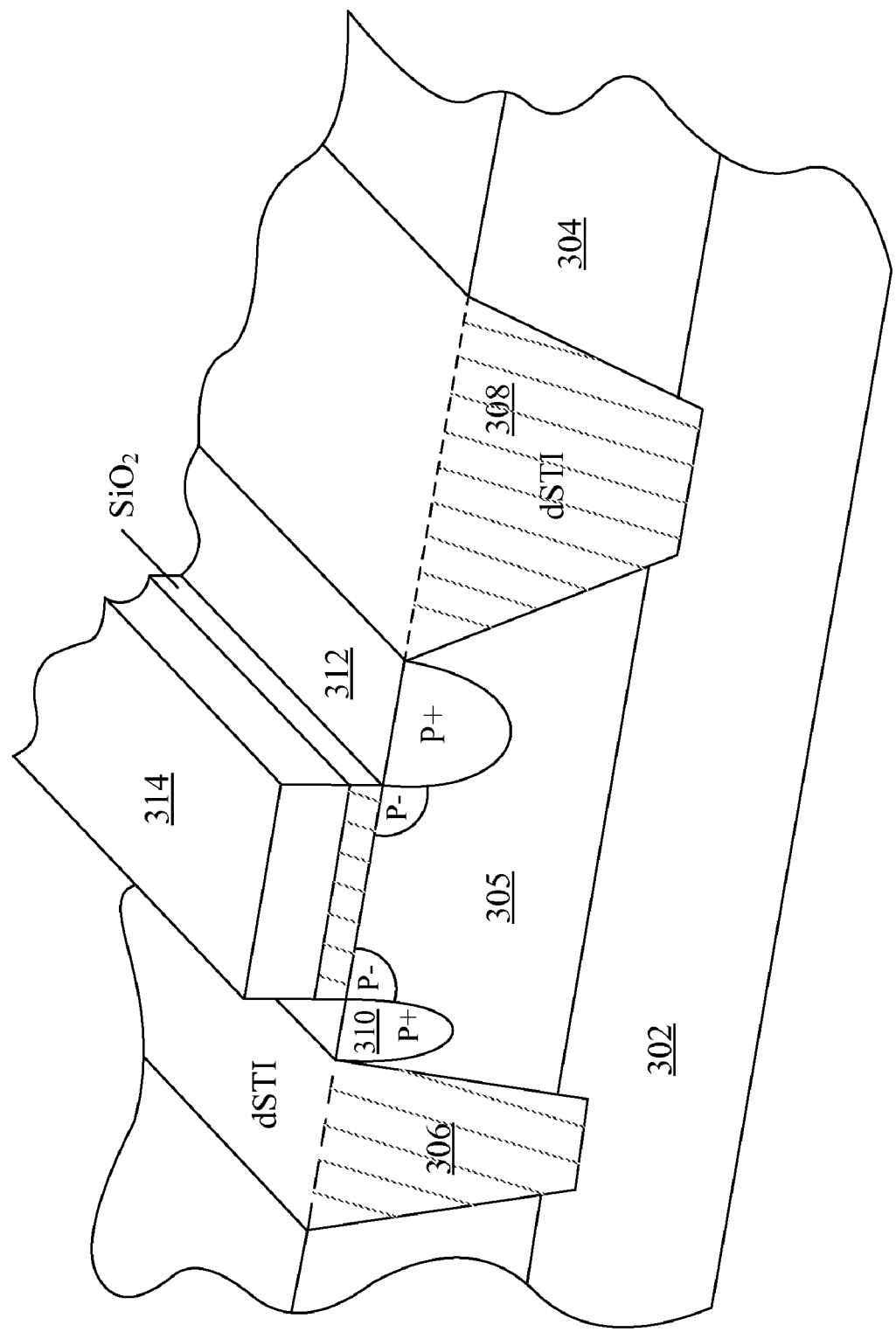
FIG. 3b illustrates a three dimensional illustration of an embodiment of the present invention.

Referring to FIG. 3b, here a 3-d view of an embodiment of the present invention is illustrated. There is the p-substrate 302 and an n-well 304 on the substrate 302. There are the dSTI areas 306 and 308 forming the isolation trench. The poly 314 of the active device is shown and there are the p+ terminals, 310 and 312. Note that the depth of the isolation trenches, 306 and 308, are deeper than the well 304 and a floating well 305 is formed.

Further variations of present invention can be formed. Referring to FIG. 4A, an active device 504 is deposited in an n-well and the active device 504 having a source terminal 506, a drain terminal 508 and a gate terminal 510. The storage region/floating well 520 can be programmed to hold a positive charge, a negative charge, or a zero potential. Each state of potential can represent information. In addition, different levels of positive or negative charges can represent different information. The programming can be done via terminals 506 or 508. Note that in a variation of the present invention the shallow trench isolation ("STI") regions, 512 and 514, are at normal depth while the n-well is made shallower than conventional wells.

FIG. 4B illustrates comparisons of the depths of the trenches between embodiments of the present invention and depths of the trenches in conventional applications. For example, STI regions at 542 and 544 are conventional STI regions, while in application of the embodiments of the present invention, dSTI regions, 540 and 537, are illustrations of the possible depths of the trench isolation regions.

Figure 4C:
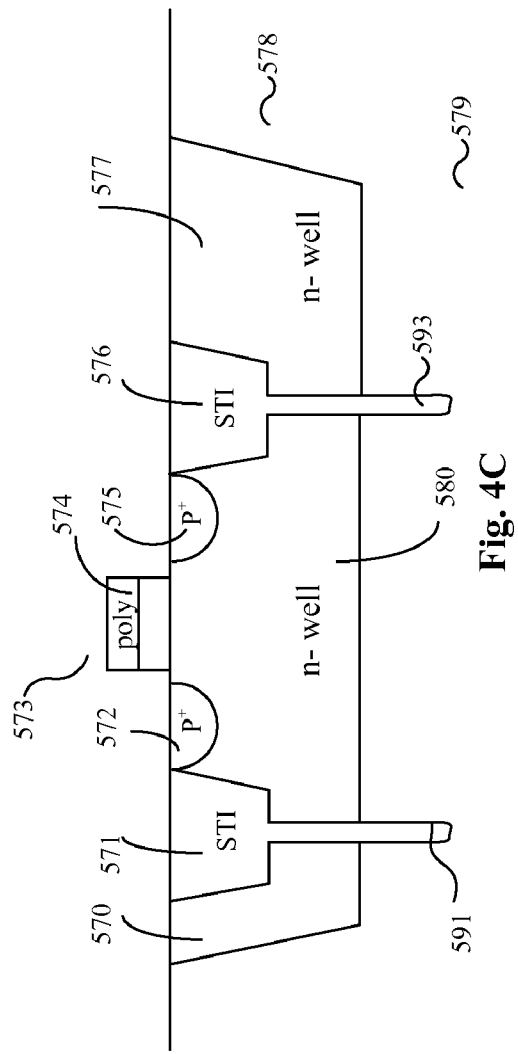
FIG. 4C illustrates another structure of the preferred embodiment of the present invention where there are various isolation trenches.

FIG. 4C illustrates yet another embodiment of the present invention. Here, the STI region has a conventional upper section, 571 and 576, and a narrow moderate trench isolation ("MTI") region in its lower section, 591 and 593. In the actual manufacturing process, the MTI wells can be made first and then the conventional upper section can be made in the typical manner. However, the structures can be made by any method. The MTI wells are then filled with insulation material or air gap.

Figure 4D:
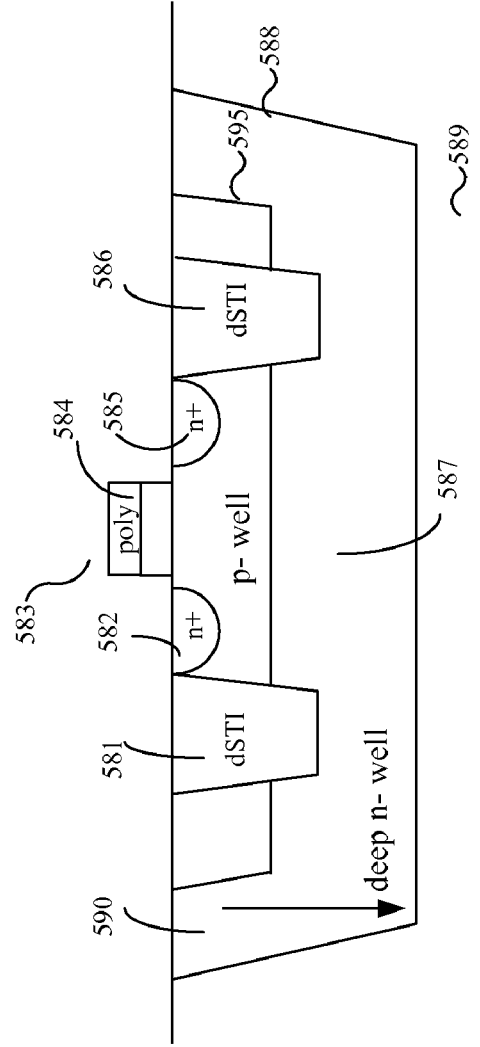
FIG. 4D illustrates another structure of the preferred embodiment of the present invention where there are various isolation trenches.

There are many methods to manufacture the various embodiments of the present invention. For example, referring to FIG. 4D, in the manufacturing of a nMOS device, there is a deep n-well 587. Within the deep n-well, there is a p-well 595 and the nMOS device is deposited thereon. The dSTI regions, 581 and 586, are manufactured in a conventional manner and they are deeper than the p-well 595.

Given the embodiments of the present invention where there are now structures in place for the storage of voltage potential, these storage regions can now be programmed accordingly to represent information. In program a device of the present invention, in forward bias mode, a voltage potential can be applied at either the source or drain terminal to program the floating region. In a second programming mode, the gate-induced drain leakage ("GIDL") method can be applied where a voltage potential is applied at the gate and at the drain terminals, where band-band tunneling occurs and leakage from drain LDD occurs to program the floating well. In a third programming mode, impact ionization can be caused to occur to program the floating well. In reading an active device, the current difference from different charged floating well is sensed out by applying voltage potential at the drain terminal, gate terminal and/or the source terminal and thus, signal can be read to determine the charge or voltage level in the floating well. Other modes such as reading and erasing modes can use conventional methods.

Although the present invention has been described using pmos and nmos transistors, other transistors technologies are equally applicable. While the invention has been described in details with reference to the present embodiment, it shall be appreciated that various changes and modifications are possible to those skilled in the art without departing the spirit of the invention. Thus, the scope of the invention is intent to be solely defined in the accompanying claims.

What is claimed is:

1. A semiconductor device, comprising:
   a substrate;
   a first well formed in said substrate having a first depth, wherein said well having a first doped polarity;
   an active device in said first well; and
   isolation trenches having a depth that is deeper than said first depth and electrically isolating said active device, wherein said trenches are disposed directly in said well and on two sides of the active device thereby defining a first storage region capable of holding three different potential states (a positive charge, a negative charge, or a zero potential) and thereby representing three different information states, wherein the well is divided into a plurality of regions by said isolation trenches, and wherein said regions are capable of holding different voltage potentials.

2. The semiconductor device of claim 1 wherein the isolation trenches form an electrically-isolated floating well.

3. The semiconductor device of claim 1 wherein each of said trenches has an upper section and a lower section, wherein the upper section is a conventional trench and the lower section is a narrow trench.

4. The semiconductor device of claim 1 wherein said trenches are deeper than the first well.

5. The semiconductor device of claim 1 further comprising a second well, wherein said first well is shallower than the second well.

6. The semiconductor device of claim 1 wherein said first well is an n-well and said substrate is a p-substrate, and said active device is a pmos.

7. The semiconductor device of claim 1 wherein said first well is an p-well and said substrate is a deep n-well, and said active device is a nmos.

8. The semiconductor device of claim 1 wherein said semiconductor device uses bulk cmos process.

9. A method for manufacturing a semiconductor device, comprising the steps of:
   providing a substrate;
   forming a first well deposited in said substrate, said first well having a first depth and a first doped polarity;
   forming isolation trenches directly in said first well, said isolation trenches having a depth deeper than said first depth, wherein the well is divided into a plurality of regions by said isolation trenches, and wherein said regions are capable of holding different voltage potentials; and
   forming an active device, wherein the active device is electrically isolated by said isolation trenches and adjacent to said isolation trenches, and wherein the trenches define a first storage region capable of holding three different potential states (a positive charge, a negative charge, or a zero potential) and thereby representing three different information states.

10. The method of claim 9 wherein the isolation trenches form an electrically-isolated floating well.

11. The method of claim 9 wherein each of said trenches has an upper section and a lower section, wherein the lower section is narrower than the upper section.

12. The method of claim 9 wherein said trenches are deeper than the first well.

13. The method of claim 9 further comprising the step, after the first forming step, of: forming a second well deposited in said substrate, wherein said first well is shallower than the second well.

14. The method of claim 9 wherein said first well is an n-well and said substrate is a p-substrate, and said active device is a pmos.

15. The method of claim 9 wherein said first well is an p-well and said substrate is a deep n-well, and said active device is a nmos.

16. The method of claim 9 wherein said semiconductor device uses bulk cmos process.

* * * * *